United States Patent [19]

Matsukawa

[11] Patent Number: 4,573,14:

[45] Date of Patent: Feb. 25, 198

[54] SEMICONDUCTOR MEMORY DEVICE HAVING TUNNEL DIODES

[75] Inventor: Naohiro Matsukawa, Yokohama, Japan

[73] Assignee: Tokyo Shibaura Denki Kabushiki Kaisha, Japan

[21] Appl. No.: 472,605

[22] Filed: Mar. 7, 1983

[30] Foreign Application Priority Data

Mar. 8, 1982 [JP] Japan .................. 57-36019

[51] Int. Cl.$^4$ .......................................... G11C 11/38
[52] U.S. Cl. ............................................... 365/175
[58] Field of Search ................. 365/105, 175, 243

[56] References Cited

U.S. PATENT DOCUMENTS 3,855,582 12/1974 Roberts ........................... 365/203

FOREIGN PATENT DOCUMENTS 2425739 1/1975 Fed. Rep. of Germany ...... 365/175

OTHER PUBLICATIONS

Data of an Expert Committee on the Research of Elec tronic Computers—the Institute of Electronics an Communications Engineers of Japan—"Possibility c Super High-Speed Computers Using an Esaki Diode'

Primary Examiner—James W. Moffitt
Attorney, Agent, or Firm—Finnegan, Henderson, Farabow, Garrett & Dunner

[57] ABSTRACT

A semiconductor memory device has at least one mem ory cell which includes first and second tunnel diode connected in series in a forward-bias direction betwee first and second power source terminals. The first an second power source terminals are held at constar potentials. A switching MOS transistor is connected a one end to a connection point between the first an second tunnel diodes. The potential at the connectio point between the first and second tunnel diodes is de termined by the potential at the other end of the switcl ing MOS transistor.

7 Claims, 4 Drawing Figures 3,573,143

SEMICONDUCTOR MEMORY DEVICE HAVING TUNNEL DIODES

BACKGROUND OF THE INVENTION

This invention relates to a semiconductor memory device having tunnel diodes.

Two types of random-access memories (RAMs) are known, i.e., a dynamic RAM and a static RAM. A dynamic RAM has a plurality of memory cells each formed of one MOS transistor and one capacitor. A static RAM has a plurality of memory cells each formed of six MOS transistors or four MOS transistors and two resistors. The dynamic RAM needs to undergo a data refreshing operation in order to preserve the data stored therein. The static RAM cannot be made with a high packing density because each of its memory cells includes many elements.

SUMMARY OF THE INVENTION

An object of the present invention is to provide a semiconductor memory device which need not undergo data refreshing operation and which can be formed of a small number of elements.

A semiconductor device according to the invention comprises at least one memory cell including first and second tunnel diodes connected in series in a forward-bias direction between a first terminal held at a substantially constant potential and a second terminal held at a reference potential and a switching means connected at one end to a connection point between the first and second tunnel diodes, a bit line connected to the other end of the switching means, a word line connected to the switching means for supplying a signal to control the switching means, and means for setting the potential at a connection point between the first and second tunnel diodes to a predetermined level through the bit line.

According to the invention, the switching means is closed to set the potential on the data line at a predetermined level, thereby writing data into the memory cell. The data is held by a current which flows through the first and second tunnel diodes. A data refreshing operation is thus unnecessary. Since each memory cell is composed of two tunnel diodes and one switching means, the semiconductor memory device of the invention can be constituted by a small number of elements.

DETAILED DESCRIPTION OF THE PREFERRED EMBODIMENT

Figure 1:
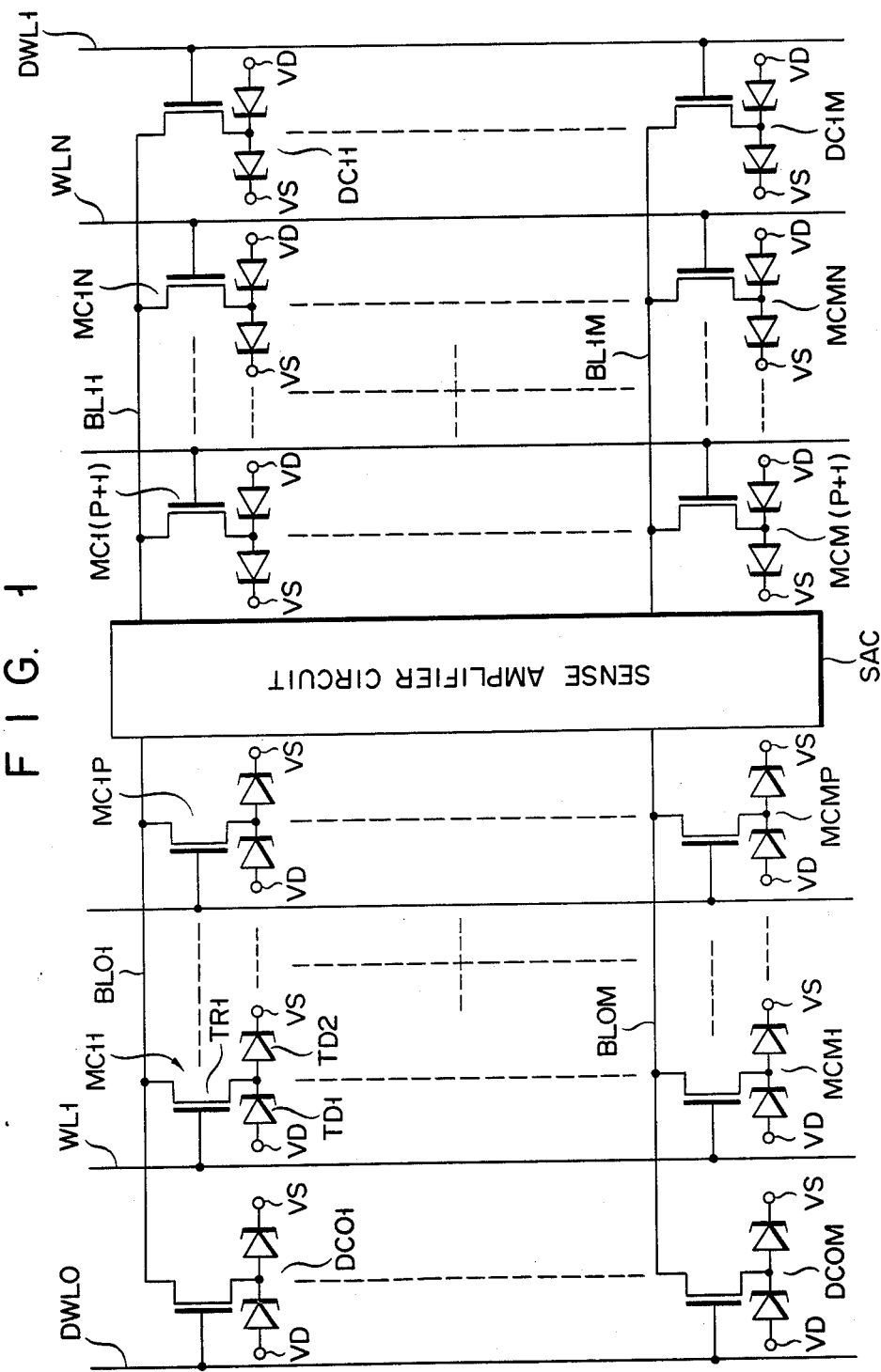
FIG. 1 is a circuit diagram of a semiconductor memory device embodying the present invention.

FIG. 1 shows a memory device embodying the present invention. The memory device includes memory cells MC11 to MCMP which are arranged in a matrix array and other memory cells MC1(P+1) to MCMN which are also arranged in a matrix array. The device further includes bit lines BL01 to BL0M each connected to those memory cells MC11 to MCMP which are arranged in the same row, bit lines BL11 to BL1M each connected to those memory cells MC1(P+1) to MCMN which are arranged in the same row, and word lines WL1 to WLN each connected to those memory cells MC11 to MCMN which are arranged in the same column. The memory device further includes a sense amplifier circuit SAC which is connected to the bit lines BL01 to BL0M and also to the bit lines BL11 to BL1M. The device has dummy cells DC01 to DC0M connected to the bit lines BL01 to BL0M, respectively and other dummy cells DC11 to DC1M connected to the bit lines BL11 to BL1M, respectively. The dummy cells DC01 to DC0M are connected to a word line DWL0, and the dummy cells DC11 to DC1M to a word line DWL1.

The memory cells MC11 to MCMP, memory cells MC1(P+1) to MCMN, dummy cells DC01 to DC0M and dummy cells DC11 to DC1M are each formed of a switching MOS transistor and two tunnel diodes (or Esaki diodes). Each MOS transistor has its gate connected to the corresponding word line and its current path connected at one end to the corresponding bit line. Corresponding two tunnel diodes are connected in series in a forward-bias direction between power source terminals VD and VS. A connection point between the tunnel diodes is coupled to the other end of the current path of the switching MOS transistor.

Figure 2:
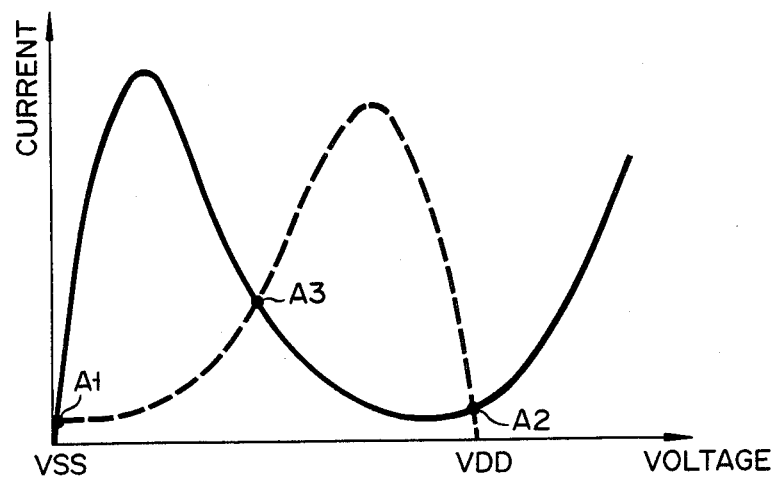
FIG. 2 illustrates the voltage-current characteristics of two tunnel diodes used in the memory device shown in FIG. 1.

Suppose the word line WL1 is made active and the switching MOS transistor TR1 of the memory cell MC11 is turned on. The potential on the bit line BL01 then changes. The currents flowing through the tunnel diodes TD1 and TD2 of the memory cell MC11 vary as shown in FIG. 2. Specifically, the current flowing through the diode TD2 changes as indicated by a solid-line curve and the current flowing through the diode TD1 changes as represented by a broken-line curve.

As will be clearly understood from FIG. 2, current flows through the switching MOS transistor TR1 except for the points A1, A2 and A3 (hereinafter referred to as "current stable points") where the same current flows through the tunnel diodes TD1 and TD2. When the transistor TR1 is turned off while the current is flowing through the transistor TR1, the potential at the connection point between the diodes TD1 and TD2 changes to a value corresponding to one of the current stable points A1, A2 and A3. If the potential on the bit line BL01 is set at, for example, about VSS level while the transistor TR1 is on, and the transistor TR1 is thereafter turned off, the potential at the connection point between the diodes TD1 and TD2 will be held at a potential VA1 which corresponds to the current stable point A1. If the potential on the bit line BL01 is set at about VDD level while the transistor TR1 is on and the transistor TR1 is thereafter turned off, the potential at the connection point between the diodes TD1 and TD2 will be held at a potential VA2 which corresponds to the current stable point A2. The potential at the connection point between the two tunnel diodes of any memory cell other than the cell MC11 can be selectively set at the potential VA1 or VA2 in a similar manner. In this case, it is preferable that the points A1 and A2 be set at or near the minimal points of the V-I characteristic curves of the tunnel diodes TD1 and TD2, respectively so that minimum currents will flow at the current stable points A1 and A2.

Figure 3:
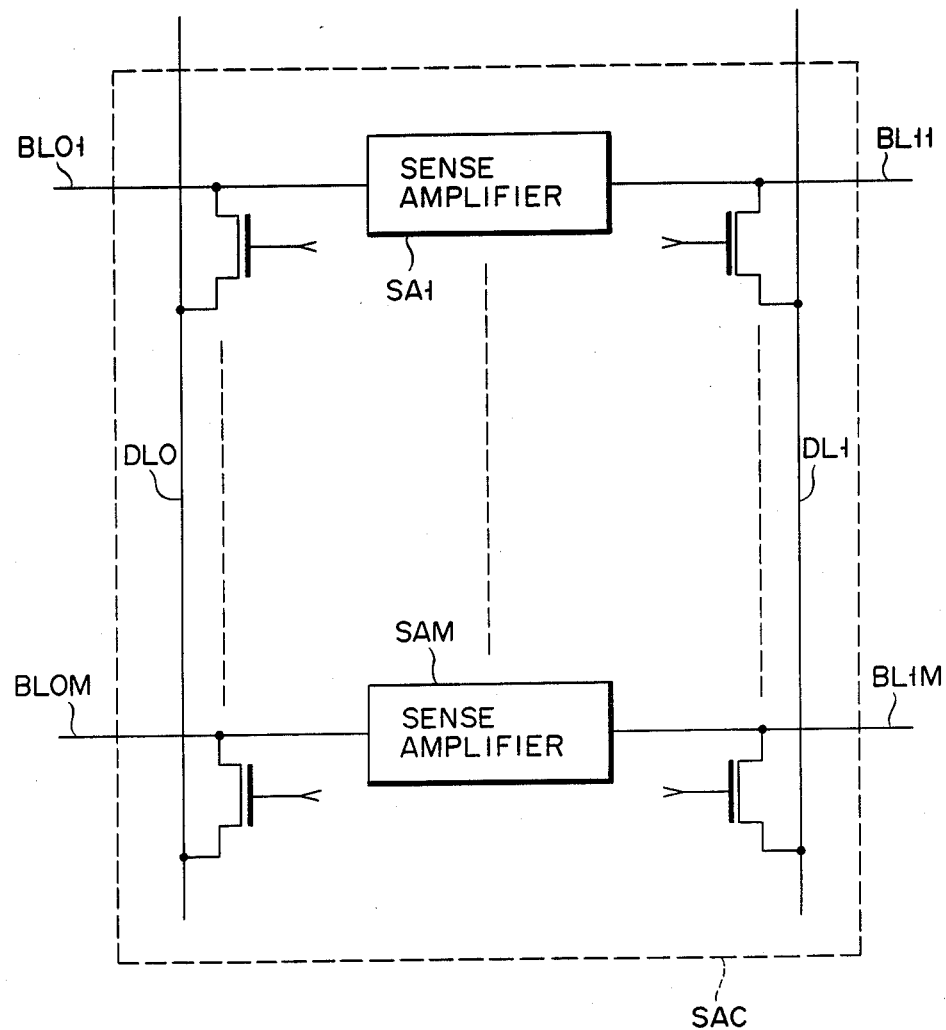
FIG. 3 shows a sense amplifier circuit used in the memory device shown in FIG. 1.

Moreover, the potential at a connection point between the two tunnel diodes of, for example, the dummy cell DC11 can be set at a potential level VA3 which corresponds to the current stable point A3. This is achieved by setting the potential on the bit line BL11 substantially equal to the potential level VA3, e.g. (VDD+VSS)/2 by means of the sense amplifier circuit SAC while the word line DWL1 is kept active, and then rendering the word line DWL1 inactive. As shown in FIG. 3, the circuit SAC includes sense amplifiers SA1 to SAM, switching MOS transistors each connected between a data line DL0 and a corresponding one of bit lines BL01 to BL0M, and other switching MOS transistors each connected between a data line DL1 and a corresponding one of bit lines BL11 to BL1M. Both data lines DL0 and DL1 are connected to an external circuit (not shown). The potential on the bit line BL11 can thus be set at (VDD+VSS)/2 when the external circuit sets the potential on the data line DL0 at (VDD+VSS)/2 and one of the switching MOS transistors connected to the bit line BL11 is turned on, and consequently a potential at the connection point between the two tunnel diodes of the dummy cell can be set at the potential VA3.

To read data from, for example, the memory cell MC11, the word lines WL1 and DWL1 are made active. The potential on the bit line BL01 is then set at the potential level VA1 or VA2 according to the data stored in the memory cell MC11. At the same time, the potential on the bit line BL11 is set at the potential level VA3. The sense amplifier circuit SAC senses the difference between the potentials on the bit lines BL01 and BL11, thus reading the data from the memory cell MC11. In order to reduce the power consumption of each dummy cell, it is preferable to write data of potential level VA3 into the dummy cell immediately before the data reading cycle and to write data of potential level VA1 or VA2 into the dummy cell after the data reading cycle.

In the memory device shown in FIG. 1, each of the memory cells is comprised of one MOS transistor and two tunnel diodes. Each memory cell can store the data without being subjected to a data refreshing operation. The memory device can therefore be made with a high packing density.

Figure 4:
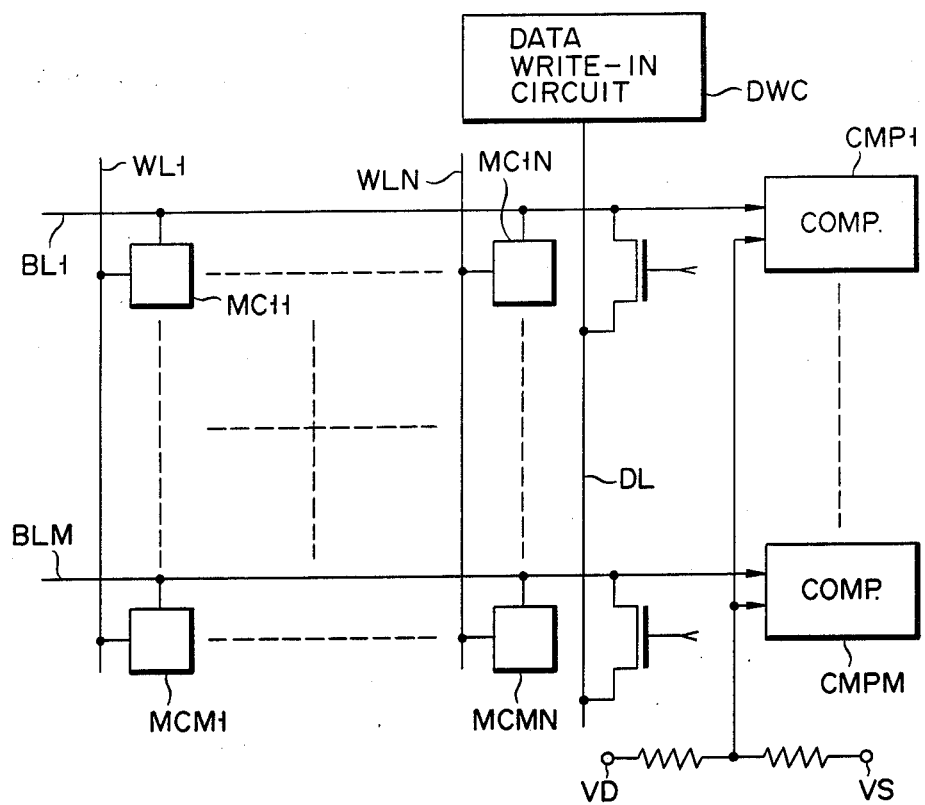
FIG. 4 shows another semiconductor memory device embodying the present invention.

The present invention is not limited to the embodiment described above. The dummy cells DC01 to DC0M and the dummy cells DC11 to DC1M may be omitted and the sense amplifier circuit SAC may be replaced by comparators CMP1 to CMPM as shown in FIG. 4. In the embodiment of FIG. 4, the comparators CMP1 to CMPM compare potentials on bit lines BL1 to BLM with a reference potential, and data can be read out from memory cells MC11 to MCMN. The reference potential is applied from, for example, a connection point between two resistors which are connected in series between power source terminals VD and VS.

To write data into each memory cell of the device shown in FIG. 4 from a data write-in circuit, one of the MOS transistors which is connected between a data line DL and one of the bit lines BL1 to BLM which is connected to the memory cell, is turned on by a control signal from an external circuit (not shown).

Further, the two tunnel diodes of each of the dummy cells used in the device of FIG. 1 may be replaced by two high resistance elements.

What is claimed is:

1. A semiconductor memory device comprising:
    at least one memory cell having first and second power source terminals held at substantially constant potentials, first and second tunnel diodes connected in series in a forward-bias direction between the first and second power source terminals and a switching means connected at one end to a connection point between the first and second tunnel diodes;
    a bit line connected to the other end of said switching means; and
    a word line connected to said switching means to supply a signal for controlling the conduction state of said switching means, the potential at the connection point between said first and second tunnel diodes being set at one of predetermined first and second potential levels during a write operation according to the potential on said bit line.

2. A semiconductor memory device according to claim 1, further comprising at least one dummy cell which has two tunnel diodes and a switching means connected to a connection point between the two tunnel diodes.

3. A semiconductor memory device according to claim 2, wherein the connection point between said two tunnel diodes of said dummy cell is set at a potential level between the first and second potential levels.

4. A semiconductor memory device according to claim 2, wherein said switching means is a MOS transistor.

5. A semiconductor memory device according to claim 1, wherein said switching means is a MOS transistor.

6. A memory cell comprising:
    first and second power source terminals held at substantially constant potentials;
    first and second tunnel diodes connected in series in a forward-bias direction between said first and second power source terminals; and
    a switching means connected at one end to a connection point between said first and second tunnel diodes, the potential at the connection point being set at approximately one of the first and second predetermined potential levels according to the potential at the other end of said switching means.

7. A memory cell according to claim 6, wherein said switching means is a MOS transistor.

* * * * *